(12) United States Patent
Tega et al.

(10) Patent No.: US 11,967,624 B2
(45) Date of Patent: Apr. 23, 2024

(54) SEMICONDUCTOR DEVICE

(71) Applicant: Hitachi, Ltd., Tokyo (JP)

(72) Inventors: Naoki Tega, Tokyo (JP); Digh Hisamoto, Tokyo (JP); Takeru Suto, Tokyo (JP)

(73) Assignee: HITACHI, LTD., Tokyo (JP)

( * ) Notice: Subject to any disclaimer, the term of this patent is extended or adjusted under 35 U.S.C. 154(b) by 405 days.

(21) Appl. No.: 17/423,603

(22) PCT Filed: Oct. 17, 2019

(86) PCT No.: PCT/JP2019/040859
§ 371 (c)(1),
(2) Date: Jul. 16, 2021

(87) PCT Pub. No.: WO2020/179121
PCT Pub. Date: Sep. 10, 2020

(65) Prior Publication Data
US 2022/0115512 A1    Apr. 14, 2022

(30) Foreign Application Priority Data

Mar. 4, 2019   (JP) ................. 2019-038144

(51) Int. Cl.
*H01L 21/66*   (2006.01)
*H01L 29/16*   (2006.01)
(Continued)

(52) U.S. Cl.
CPC ........ *H01L 29/42356* (2013.01); *H01L 22/34* (2013.01); *H01L 29/1608* (2013.01); *H01L 29/41725* (2013.01)

(58) Field of Classification Search
CPC ............. H01L 29/42356; H01L 22/34; H01L 29/1608; H01L 29/41725; H01L 25/072;
(Continued)

(56) References Cited

U.S. PATENT DOCUMENTS 4,945,445 A    7/1990  Schmerda et al.
5,557,234 A *  9/1996  Collins ............... H03F 3/45479
                                                    327/563

(Continued)

FOREIGN PATENT DOCUMENTS

JP    201280062 A    4/2012
JP    2013247309 A   12/2013
(Continued)

OTHER PUBLICATIONS

Search Report dated Jan. 7, 2020 in International Application No. PCT/JP2019/040859.
(Continued)

*Primary Examiner* — Elias Ullah
(74) *Attorney, Agent, or Firm* — Miles & Stockbridge, P.C.

(57) ABSTRACT

Abnormal generation of heat of a power MOSFET is detected to improve the reliability of a semiconductor device. As its means, in a power MOSFET having a drain electrode on the side of a back surface of a semiconductor substrate and a source pad on the side of a main surface of the semiconductor substrate, two gate pads electrically connected to a gate pad connected to a gate electrode of the power MOSFET are formed on the side of the main surface of the semiconductor substrate. Further, there is provided a voltmeter connected in parallel with each of two current paths which connect the two gate pads and a gate driver.

14 Claims, 11 Drawing Sheets

(51) Int. Cl.
*H01L 29/417* (2006.01)
*H01L 29/423* (2006.01)

(58) Field of Classification Search
CPC ......... H01L 29/7815; H01L 2224/0603; H01L 25/18
See application file for complete search history.

(56) References Cited

U.S. PATENT DOCUMENTS

| | | | |
|---|---|---|---|
| 2012/0061722 | A1 | 3/2012 | Hashimoto et al. |
| 2013/0320454 | A1 | 12/2013 | Suzuki et al. |
| 2015/0250074 | A1 | 9/2015 | Matsumoto et al. |
| 2015/0280611 | A1 | 10/2015 | Kusumoto et al. |
| 2016/0322347 | A1* | 11/2016 | Meiser .................. H05B 45/48 |

FOREIGN PATENT DOCUMENTS

| | | | |
|---|---|---|---|
| JP | 2015115523 | A | 6/2015 |
| JP | 201612670 | A | 1/2016 |
| JP | 2016046279 | A | 4/2016 |
| JP | 2016136819 | A | 7/2016 |
| JP | 2016145774 | A | 8/2016 |
| WO | 2015004891 | A1 | 1/2015 |

OTHER PUBLICATIONS

Written Opinion dated Jan. 7, 2020 in International Application No. PCT/JP2019/040859.

* cited by examiner

SEMICONDUCTOR DEVICE

TECHNICAL FIELD

The present invention relates to a semiconductor device, and is particularly applicable to a semiconductor device having a MOSFET.

BACKGROUND ART

Semiconductor power elements are required to have low on-resistance and a low switching loss in addition to a high breakdown voltage, but a silicon (Si) power element that is currently mainstream is approaching a theoretical performance limit. The silicon carbide (SiC) is larger about one digit in insulation breakdown electric field strength than Si. Therefore, as compared with the Si power element, the thickness of a drift layer maintaining a breakdown voltage is made thin to about ⅒, and the impurity concentration of the drift layer is increased by about 100 times, whereby an element resistance can be theoretically reduced by 3 digits or more. Further, since SiC has a bandgap about three times larger than Si, SiC can also operate at high temperatures. Therefore, the SiC semiconductor element is expected to outperform the Si semiconductor element.

Patent Literature 1 (Japanese Unexamined Patent Application Publication No. 2016-046279) has described that a plurality of gate pads are formed in an electrode surface of a semiconductor power element.

CITATION LIST

Patent Literature

PTL 1: Japanese Unexamined Patent Application Publication No. 2016-046279

SUMMARY OF INVENTION

Technical Problem

A semiconductor power element having MOSFETs (Metal Oxide Semiconductor Field Effect Transistor, MOS type field effect transistor) has a risk that the load is concentrated due to characteristic variations of the internal MOSFET or the like, thus causing destruction due to thermal runaway. On the other hand, there is also a method of monitoring the value of a source current, but it is difficult to distinguish a small current change due to a change in temperature from noise and detect it. Further, a method of detecting a change in temperature by disposing a thermistor at the side of a semiconductor chip is also known, but has a problem in that it is low in accuracy.

Other problems and novel features will be made apparent from the description of the present specification and the accompanying drawings.

Solution to Problem

Of the embodiments disclosed in the present application, the outline of a typical one will be briefly described as follows.

A semiconductor device according to the typical embodiment includes a semiconductor chip having a MOSFET and having a first gate pad and a second gate pad on the side of a main surface thereof, a first voltmeter connected in parallel with a first wiring provided outside the semiconductor chip and electrically connected to the first gate pad, and a second voltmeter connected in parallel with a second wiring provided outside the semiconductor chip and electrically connected to the second gate pad.

Advantageous Effects of Invention

According to a typical embodiment, it is possible to improve the reliability of a semiconductor device. In particular, it is possible to prevent the semiconductor device from being destroyed by heat generation.

DESCRIPTION OF EMBODIMENTS

Figure 1:
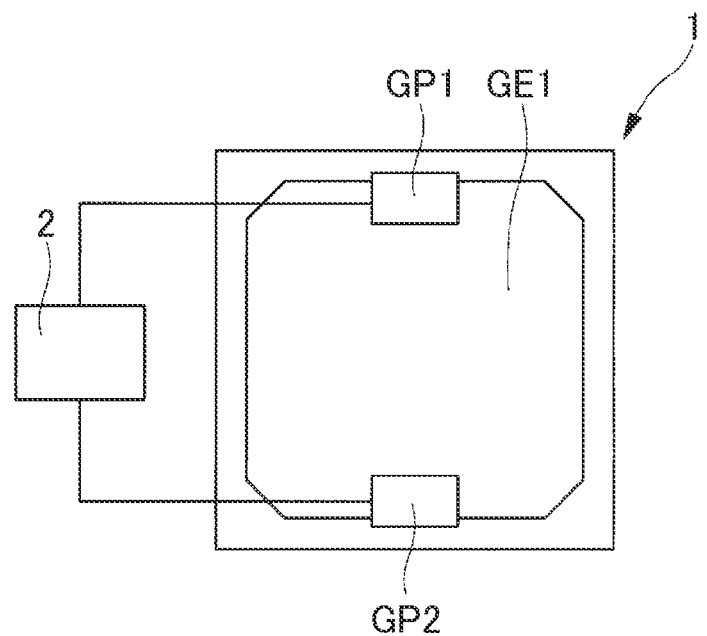
FIG. 1 is a typical circuit diagram of a semiconductor device showing a first embodiment of the present invention.

Hereinafter, embodiments of the present invention will be described in detail with reference to the drawings. Incidentally, in all the drawings for describing the embodiments, members having the same function are denoted by the same reference numerals, and repeated description thereof will be omitted. Also, in the embodiments, the description of the same or similar parts is not repeated in principle unless it is particularly necessary.

Further, signs "−" and "+" represent the relative concentrations of impurities whose conductivity type is an n-type or a p-type. For example, in the case of the n-type impurity, the impurity concentration becomes high in order of "$n^-$", "n", and "$n^+$".

First Embodiment

Constitution of Semiconductor Device

Figure 2:
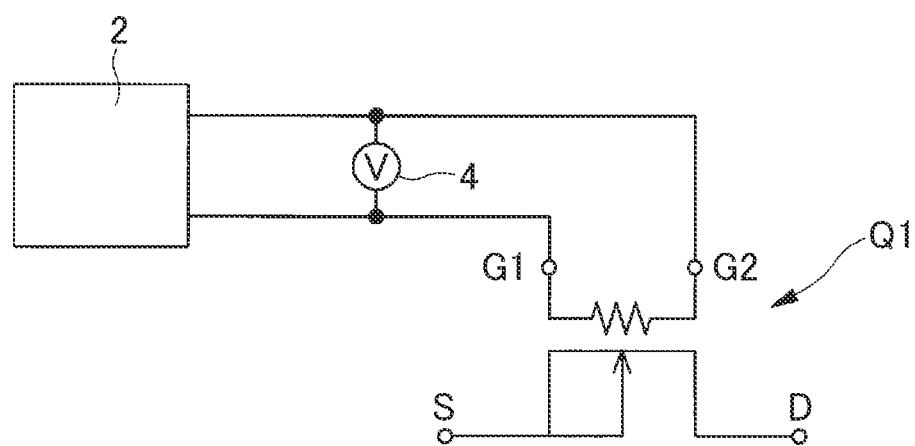
FIG. 2 is a circuit diagram of the semiconductor device showing the first embodiment of the present invention.

Hereinafter, the structure of a semiconductor device of the present first embodiment will be described using FIGS. 1 and 2. FIG. 1 is a typical circuit diagram of the semiconductor device of the present embodiment. FIG. 2 is a circuit diagram of the semiconductor device of the present embodiment. In FIG. 1, there are shown a plan view of a semiconductor chip which constitutes the semiconductor device of the present embodiment, and a gate driver. Also, in FIG. 1, there are shown only gate pads and a gate electrode as parts which constitute the semiconductor chip.

The semiconductor device of the present embodiment includes a plurality of gate pads provided in a main surface of a semiconductor chip loaded with a MOSFET (power MOSFET), and, when abnormal heat generation occurs in the semiconductor chip, detects the heat generation from a potential difference or a signal waveform between the gate pads to prevent the semiconductor chip from breaking.

The semiconductor chip 1 of the present embodiment shown in FIG. 1 is provided with a MOSFET (Metal Oxide Semiconductor Field Effect Transistor, MOS type field effect transistor) in the central part in plan view. MOSFET is a kind of MISFET (Metal Insulator Semiconductor Field Effect Transistor). The MOSFET is a vertical MOSFET having source regions each provided on the side of a main surface (upper surface) of a semiconductor substrate, drain regions each provided on the side of a back surface (lower surface) opposite to the main surface of the semiconductor substrate, and a gate electrode GE1 provided on the main surface of the semiconductor substrate. A concrete structure of MOSFET will be described later using FIG. 14 in a second embodiment. The semiconductor substrate is comprised of SiC (Silicon Carbide). A silicon carbide semiconductor device using a SiC substrate will be described here as an example, but the semiconductor substrate may be an Si (Silicon) substrate.

The shape of the semiconductor chip 1 as seen in plan view is rectangular. The gate electrode GE1 made of a polysilicon film formed on the semiconductor substrate is formed so as to widely cover the entire main surface except for a peripheral edge portion of the semiconductor chip 1. However, the gate electrode GE1 has, for example, a plurality of openings provided in zigzags in plan view. The source regions are formed in the main surface of the semiconductor substrate exposed from the gate electrode GE1 within those openings. Upon the operation of the power MOSFET, electrons flow from the source regions to the drain regions through a channel in the semiconductor substrate, which is close to the gate electrode GE1 via a gate insulating film, whereby a current flows through the power MOSFET. That is, current paths exist around the respective source regions in the plural openings provided in zigzags. Namely, the semiconductor chip 1 can be regarded as one MOSFET. However, in actuality, the semiconductor chip 1 has a structure in which a plurality of MOSFETs (unit cells) constituted by each of those plural source regions are connected in parallel. The power MOSFET of the present embodiment is a power MOSFET (semiconductor power element) driven by a relatively high voltage and having a high breakdown voltage.

The gate electrode GE1 is formed on an interlayer insulating film (not shown) covering the gate electrode GE1 and electrically connected to each of two gate pads GP1 and GP2 separated away from each other. Each of the gate pads GP1 and GP2 is a conductive connecting part (electrode pad) for connecting (bonding) a bonding wire or the like, and is made mainly of Al (aluminium), for example. The bonding wire is a wiring used to electrically connect the semiconductor chip 1 and a device outside the semiconductor chip 1. The most part of the main surface of the semiconductor chip 1 exposed from the gate pads GP1 and GP2 is covered by source pads arranged away from the gate pads GP1 and GP2 (refer to FIG. 13), but the illustration of the source pads is omitted in FIG. 1. Further, although not shown in the drawing, the back surface of the semiconductor substrate is covered with a drain electrode electrically connected to the drain regions.

Each of the gate pads GP1 and GP2 is electrically connected to a gate driver 2 which is the device outside the semiconductor chip 1. The gate driver 2 is a gate drive unit which drives a capacitive gate. That is, the gate driver 2 has the role of performing signal amplification processing or the like on the basis of a gate pulse signal generated by a control circuit (a command control unit: refer to FIG. 3) connected to the gate driver 2 and then applying a voltage (voltage pulse) to the gate electrode GE1, thereby turning ON and OFF the power MOSFET. In other words, the gate driver 2 has the role of injecting electric charges into the gate electrode GE1 upon turning ON the power MOSFET and extracting them from the gate electrode GE1 upon turning OFF the power MOSFET.

When the entire semiconductor chip 1 is regarded as one MOSFET, the MOSFET can be represented as a transistor Q1 shown in the circuit diagram of FIG. 2. As shown in FIG. 2, the transistor Q1 has a node S connected to a source, a node D connected to a drain, and nodes G1 and G2 connected to a gate. Here, for example, the node S corresponds to the source pad, the node D corresponds to the drain electrode on the side of the back surface of the semiconductor chip, the node G1 corresponds to the gate pad GP1 (refer to FIG. 1), and the node G2 corresponds to the gate pad GP2 (refer to FIG. 1).

The gate driver 2 is electrically connected to the gate electrode through the node G1 and further electrically connected to the gate electrode through the node G2. In this configuration, the gate driver 2 and wirings respectively extending from the gate driver 2 to the nodes G1 and G2 can be collectively considered to be an effective gate driver. That is, the gate driver 2 and the wirings are shown in separate circuit blocks, but they are integrated as needed and can be formed as one semiconductor chip or one circuit or the like.

One of two terminals of a voltmeter (potential measuring part) 4 for measuring the potential of the node G1 (gate pad GP1) is connected to a connecting path (a current path, a voltage applying path, a wiring) between the gate driver 2 and the node G1. Likewise, the other of the two terminals of the voltmeter (potential measuring part) 4 for measuring the potential of the node G2 (gate pad GP2) is connected to a connecting path (a current path, a voltage applying path, a wiring) between the gate driver 2 and the node G2. That is, the voltmeter 4 is connected to link between one point (node) in the middle of the connecting path between the gate driver 2 and the node G1 and one point (node) in the middle of the connecting path between the gate driver 2 and the node G2. The voltmeter 4 is used to detect a difference in potential between the nodes G1 and G2, or a delay in voltage waveform of each of the nodes G1 and G2. That is, the voltmeter 4 is a potential difference measuring part or a waveform measuring part. The gate electrode is made of polysilicon (conductor) high in impurity concentration, but has a resistance.

One of the main features of the semiconductor device of the present embodiment resides in that the two gate pads connected to the gate of the power MOSFET are formed on the main surface side of the semiconductor chip, and in that the semiconductor device has the measuring part for measuring the potentials or waveforms of those gate pads.

Details of Room for Improvement

The plural semiconductor chips each loaded with the power MOSFET are mounted within a module which constitutes, for example, an inverter. The characteristics of those plural semiconductor chips may not be aligned due to the accuracy of a manufacturing process, etc. Further, the characteristics may vary even among the unit cells of the plural MOSFETs that constitute the semiconductor chip. In those cases, there is a risk that when a large current is driven using the power MOSFETs, the current is dispersed between the semiconductor chips in the module, whereby thermal runaway occurs when the load is concentrated on some semiconductor chips, and hence the semiconductor chips will be broken. Therefore, in view of realizing a high reliable and high efficient module by using the power MOSFET, it is effective to monitor the operating state of the power MOSFET and feed back its result to a drive circuit. When the occurrence of an overcurrent or the abnormal generation of heat is detected, a drive voltage for the corresponding semiconductor chip is suppressed, or the corresponding semiconductor chip is completely cut off from the circuit without operating the corresponding semiconductor chip, whereby a module and a vehicle using the module, etc. can be protected.

As a method of monitoring the power MOSFET, there is considered a method of dividing power lines to measure currents, or a method of dividing and pulling out a source potential of the semiconductor chip, and detecting (sensing) a drive current. As the challenges of these methods, it is necessary to detect a small change for a large current which flows through the power line. That is, in a high breakdown voltage MOSFET, it is necessary to pull out a large signal to prevent a necessary signal from being buried in noise. The problem of reducing a driving force and the problem of increasing power consumption arise in these methods because the part of the drive current is used for monitoring. Further, there is also a method of installing a thermistor outside the semiconductor chip as a device which detects a temperature change in the semiconductor chip, but it is difficult to detect the change in temperature with high accuracy It is thus necessary to prevent the thermal runaway of the power MOSFET accurately while suppressing the reduction in the driving force and thereby prevent degradation in the reliability of the semiconductor device by protecting the semiconductor device from destruction. From this point of view, the power MOSFET has room for its improvement.

Advantageous Effects of the Present Embodiment

Since the gate electrode GE1 shown in FIG. 1 is electrically insulated from the channel and has high input impedance, the resistance of the gate electrode is considered to be negligible when the gate electrode is expressed by equivalent circuit symbols as a device operation. On the other hand, in the present embodiment, attention is paid to the resistance of the gate electrode. When the physical resistance is taken into consideration, the gate has a resistance as shown in FIG. 2 in the equivalent circuit symbols of the power MOSFET.

The semiconductor device of the present embodiment has a structure in which a gate wiring is connected to each of the nodes G1 and G2 at both ends of the resistance.

In the MOSFET, the resistance value of a material which makes up the gate electrode has temperature dependence. For example, when the temperature of the gate electrode GE1 rises, the resistance value of the gate electrode GE1 decreases. It is thus possible to recognize the temperature of the channel under the gate electrode GE1 by measuring the resistance between the two gate pads GP1 and GP2 (refer to FIG. 1). A gate resistance can be measured by, for example, allowing a dc current to flow between the gate pads GP1 and GP2 and detecting a difference in potential between the gate pads GP1 and GP2 by using the voltmeter 4.

However, as will be described later in third to seventh modifications and a second embodiment, no current flows between the gate pads GP1 and GP2 when each of the gate pads GP1 and GP2 is connected to a separate gate electrode in the same chip, but it is possible to detect a change in the temperature of the power MOSFET by applying the voltage to each of the gate pads GP1 and GP2.

That is, when the large generation of heat occurs in in a part of the semiconductor chip upon applying the voltage to each of the gate pads GP1 and GP2 irrespective of whether or not the gate electrodes to which the respective gate pads GP1 and GP2 are connected are electrically connected to each other, a difference in potential occurs between the gate pads GP1 and GP2, and a difference occurs in the transmission speed of the voltage waveform. This is because when the generation of heat occurs at the channel in the part of the semiconductor chip, the gate electrode heated by this is reduced in resistance value, and the time required to inject and extract electric charges gets shorter.

Even in the case where each of the gate pads GP1 and GP2 is connected to one gate electrode, actually, the gate electrode is divided into a first part supplied with a potential mainly from the gate pad GP1 and a second part supplied with a potential mainly from the gate pad GP2. That is, it can be considered that the transistor Q1 shown in FIG. 2 is divided into a first transistor including the gate electrode (first part) connected to the gate pad GP1 and a second transistor including the gate electrode (second part) connected to the gate pad GP2. The first part and the second part are integrated into one piece in contact with each other and constitute one gate electrode.

Thus, for example, when the first part of the gate electrode becomes high in temperature, the electric charge becomes easy to be accumulated as compared with the second part, and the gate pad GP1 increases in potential faster than the gate pad GP2. Consequently, for example, when the voltage of the gate pad GP2 is 1V, the potential of the gate pad GP1 is considered to become 1.5V. This means that the voltage waveform (pulse waveform which comes out through the power MOSFET) of the gate pad GP2 is delayed compared to the voltage waveform (pulse waveform which comes out through the power MOSFET) of the gate pad GP1.

In other words, the gate pad GP1 connected to the first part of the gate electrode, which is relatively high in temperature becomes smaller than the gate pad GP2 connected to the second part of the gate electrode, which is relatively low in temperature in terms of the amount of delay (time difference) of the waveform that comes out through the power MOSFET, with respect to an output waveform of the gate driver 2.

Thus, if the respective voltages of the nodes G1 and G2 are monitored (monitoring) by the voltmeter 4 shown in FIG. 2, the abnormal generation of heat at the gate electrode can be detected by detecting the generation of the difference in potential between the nodes G1 and G2 or the occurrence of the delay of the voltage waveform. The resistance value of the gate electrode, the temperature of the gate electrode, and the temperature of the channel can respectively be judged by applying the potential difference or the time difference in waveform to a plurality of data, i.e., a lookup table obtained by experiments, etc. Further, it is also possible to measure (calculate) the current value of the semiconductor chip from the resistance value.

Thus, when the abnormal rise in temperature or the overcurrent or the like in the semiconductor chip is detected, the drive voltage for the corresponding semiconductor chip is suppressed or the corresponding semiconductor chip is cut off from the circuit, so that a module and a vehicle using the module, etc. can be protected from destruction and firing, etc. Thus, it is possible to improve the reliability of the semiconductor device.

Incidentally, although description has been made here about the measurement of the difference in voltage or the waveform of the voltage by the use of the voltmeter 4, the waveform to be measured may be the waveform of a current. That is, instead of the voltmeter 4 shown in FIG. 2, an ammeter connected in series with each of the wirings extending from the gate driver 2 to the nodes G1 and G2 is provided to monitor the current waveform, whereby a rise in temperature can also be detected. Here, the gate driver 2, the voltmeter 4, and each of the wirings extending from the gate driver 2 to the nodes G1 and G2 are installed outside the module in which the plural semiconductor chips 1 (refer to FIG. 1) are arranged.

Further, since no drive current is made to flow in the gate electrode in the power MOSFET, the diameter of the bonding wire connected to each gate pad may be relatively small. Thus, the area of the gate pad is smaller than that of the source pad. Therefore, even when the small gate pad GP2 is disposed as in the present embodiment, there is no need to make the semiconductor chip larger, and there is no need to reduce the drive current with the reduction in source pad. That is, it is possible to suppress the area required for a sensing region small. In particular, the power MOSFET using SiC is higher in crystal detect density than the MOSFET using Si, and a manufacturing yield is degraded when a chip area is made large. In the present embodiment, excellent breakdown voltage characteristics and low loss characteristics possessed by SiC can be utilized by disposing the semiconductor chips in parallel within the module without enlarging the area of each semiconductor chip.

In addition, since the voltage and current of the gate electrode both operate with small amplitude as compared with the voltage and current of the source electrode, the detection of fluctuation, i.e., sensing is easy.

First Modification

The semiconductor device of the present embodiment may have a plurality of semiconductor chips. In this case, it is possible to monitor the voltages or waveforms of two or more gate pads provided in each of the plural semiconductor chips, and detect a temperature rise in the semiconductor chip by comparison between the semiconductor chips.

Figure 3:
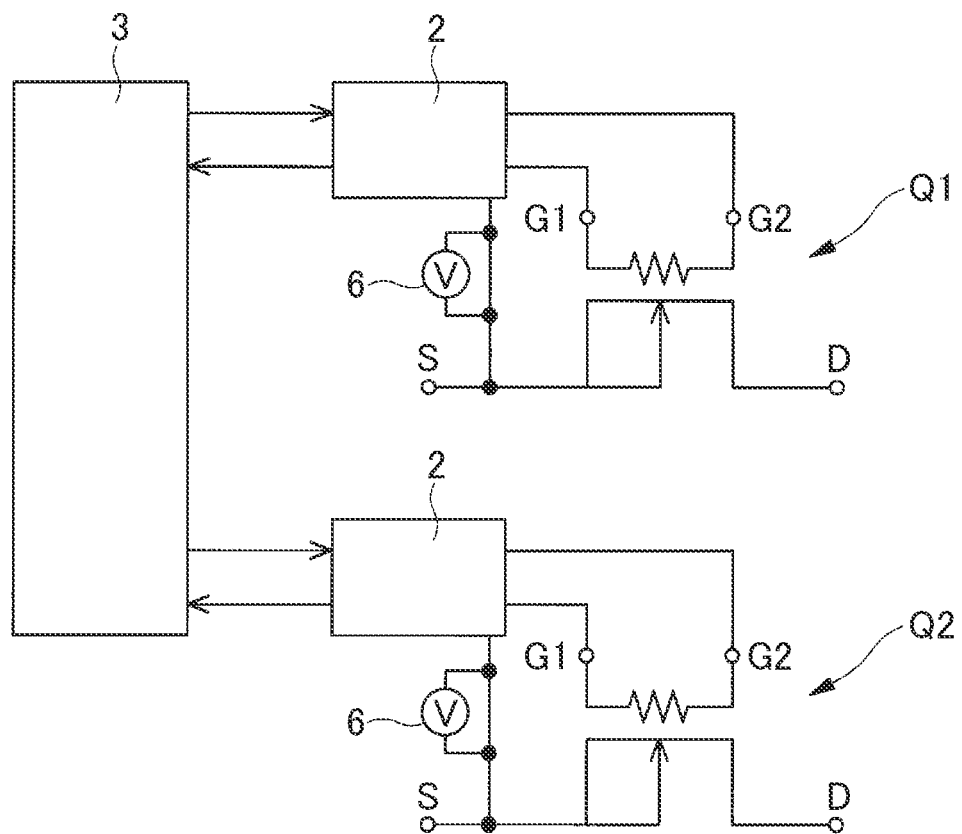
FIG. 3 is a circuit diagram of a semiconductor device showing a first modification of the first embodiment of the present invention.

FIG. 3 shows a configuration of controlling each gate driver by a signal from a command control unit. FIG. 3 is a circuit diagram showing a semiconductor device being a first modification of the present embodiment. In FIG. 3, there is illustrated a configuration in which two gate drivers 2 are provided with respect to two transistors Q1 and Q2 (two semiconductor chips). Each of the two gate drivers 2 is connected to one command control unit 3. The source of each of the transistors Q1 and Q2 is connected to the gate driver 2. A voltmeter (potential measuring part) 6 is connected in parallel with a wiring which electrically connect the source (source region) and the gate driver 2. It is possible to measure a source potential by using the voltmeter 6. Though illustration is omitted, a voltmeter 4 is connected between wirings which connect the gate driver 2 and nodes G1 and G2 of each of the transistors Q1 and Q2 as with the configuration shown in FIG. 2.

Here, the above example can be considered as effective gate drivers inclusive of the command control unit 3 and the plural gate drivers 2. With a start signal from the command control unit 3, the gate drivers 2 apply gate voltages for the transistors Q1 and Q2. Since the gate potential is operated with respect to a source voltage, each gate driver 2 feeds back the completion of its operation to the command control unit 3 as a feedback signal. It is possible to grasp an in-chip temperature from a follow-up delay time of the source potential with respect to a signal of each of the nodes G1 and G2. Incidentally, as described using FIGS. 1 and 2, the in-chip temperature may be detected using only the voltmeter 4 without using the voltmeter 6.

In the present modification, the transition of fluctuations in temperature between the chips can be detected by comparing the changes in delay times of the respective waveforms of the two power MOSFETs, and the occurrence of the deterioration in any semiconductor chip can be found.

Second Modification

Figure 4:
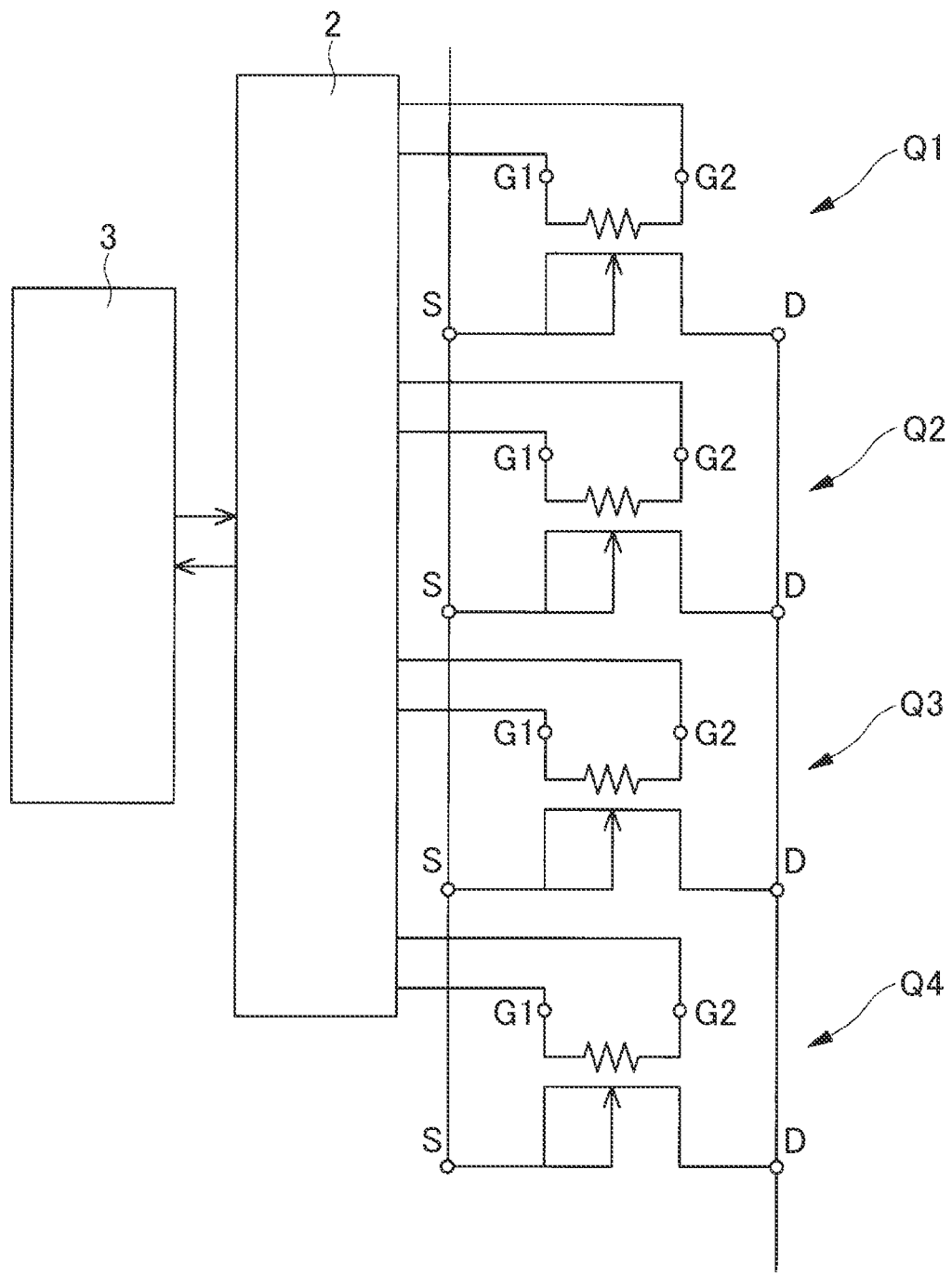
FIG. 4 is a circuit diagram of a semiconductor device showing a second modification of the first embodiment of the present invention.

As shown in FIG. 4, the number of semiconductor chips (transistors) may be three or more. FIG. 4 is a circuit diagram showing a semiconductor device being a second modification of the present embodiment.

Here, for example, four transistors Q1 to Q4 are operated in parallel. That is, respective sources of the transistors Q1 to Q4 are electrically connected to each other, and respective drains of the transistors Q1 to Q4 are electrically connected to each other. Nodes G1 and G2 connected to respective gates of the transistors Q1 to Q4 are all connected to one gate driver 2. Thus, a plurality of semiconductor chips may be connected to one gate driver 2. Although not shown in the drawing, a voltmeter 4 is connected in parallel between wirings connecting the gate driver 2 and the nodes G1 and G2 of each of the transistors Q1 to Q4 as with the configuration shown in FIG. 2. Further, the gate driver 2 is connected to a command control unit 3.

Since the load is concentrated on the semiconductor chip strong in heat generation, it is possible to perform operations such as reducing a drive voltage to make the load uniform if a temperature rise can be grasped. Further, when the abnormal generation of heat is detected, it is also possible to interrupt driving and disconnect the power MOSFET from operation. Thus, when the plural semiconductor chips are operated in parallel, a system having high reliability can be provided in the present modification. Here, as with the first modification, the voltages or waveforms of the nodes G1 and G2 are compared between the semiconductor chips, thereby making it possible to detect the semiconductor chip in which the abnormal generation of heat is occurring.

Third Modification

Using FIGS. 1 and 2, description has been made above about the connection of the two gate pads provided in one semiconductor chip to one gate electrode, but the two gate pads may be connected to two gate electrodes divided within the semiconductor chip separately.

Figure 5:
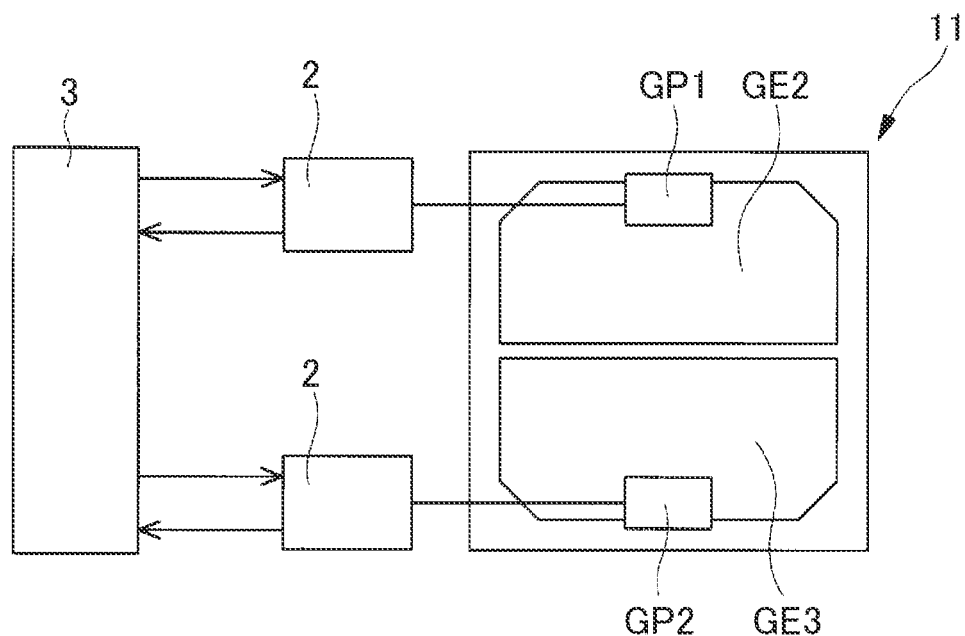
FIG. 5 is a typical circuit diagram of a semiconductor device showing a third modification of the first embodiment of the present invention.

That is, as shown in FIG. 5, a gate electrode GE2 to which of two gate pads GP1 and GP2, the gate pad GP1 is connected, and a gate electrode GE3 to which the gate pad GP2 is connected may be separated from each other. FIG. 5 is a typical circuit diagram showing a semiconductor device being a third modification of the present embodiment. The gate electrodes GE2 and GE3 included in the semiconductor chip 11 are insulated from each other and used to drive unit cells of separate MOSFETs.

Figure 6:
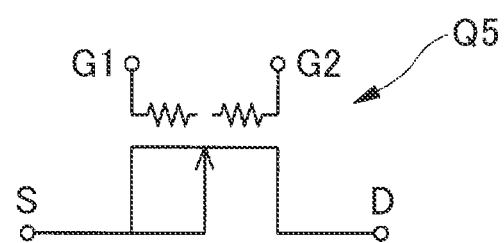
FIG. 6 is a circuit diagram of the semiconductor device showing the third embodiment of the first embodiment of the present invention.

FIG. 6 shows a circuit diagram of a transistor in the semiconductor device of the present modification. As shown in FIG. 6, a gate electrode which constitutes a transistor Q5 is divided into two unlike the transistor Q1 shown in FIG. 2.

As shown in FIG. 5, the gate pads GP1 and GP2 are respectively connected to separate gate drivers 2, but each of the gate pads GP1 and GP2 may be connected to one gate driver 2 as with the configuration shown in FIG. 1. Further, even in the embodiments other than the present modification, the gate pads GP1 and GP2 may be connected to the separate gate drivers 2 as in the present modification. The gate drivers 2 are connected to a command control unit 3. Although not shown in the drawing, a voltmeter 4 is connected in parallel between wirings connecting the gate drivers 2 and the gate pads GP1 and GP2 as with the configuration shown in FIG. 2.

Here, when the generation of heat occurs in the MOSFET including the gate electrode GE2 or the MOSFET including the gate electrode GE3 within the semiconductor chip 11, the comparison of the voltage or waveform is performed within the same semiconductor chip 11. Therefore, since each MOSFET in the same semiconductor chip 11 is low in characteristic fluctuation, and device parameters are almost the same, the generation of heat can be detected with high accuracy.

Fourth Modification

Figure 7:
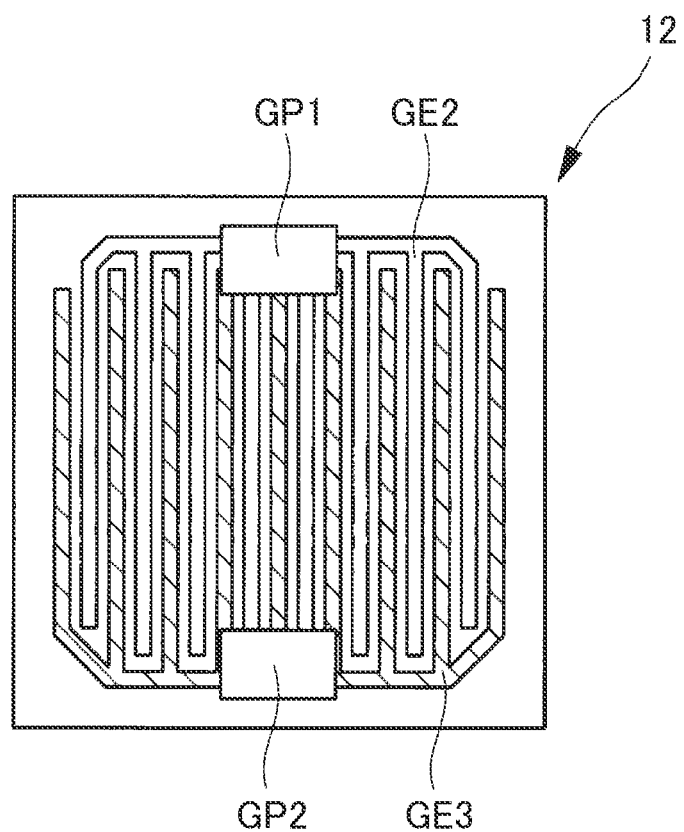
FIG. 7 is a typical circuit diagram of a semiconductor device showing a fourth modification of the first embodiment of the present invention.

As shown in FIG. 7, each of gate electrodes GE2 and GE3 respectively connected to gate pads GP1 and GP2 has a comb-shaped flat shape. Comb-teeth parts of the gate electrodes GE2 and GE3 may be disposed to mesh with each other. That is, each of the gate electrodes GE2 and GE3 has a plurality of extended parts extending along one side of a rectangular semiconductor chip 12. The extended parts are arranged in plural in the transverse direction thereof. The extended parts of the gate electrodes GE2 and GE3 are alternately arranged in the transverse direction. FIG. 7 is a typical circuit diagram showing a semiconductor device being a fourth modification of the present embodiment. In FIG. 7, the gate electrode GE3 is hatched to make it easy to understand the drawing.

Thus, the extended parts (gate wirings) are divided into regions for the gate electrodes GE2 and GE3 every separate pieces, thereby making it possible to monitor a change in temperature and separately control input signals for respective MOSFETs adjacent within the semiconductor chip 12. For example, effective soft switching can be realized by slightly shifting an input pulse. The soft switching refers to prevent the operations of rising and falling of a pulse waveform from becoming steep and thereby to prevent the generation of noise, for example.

Fifth Modification

Figure 8:
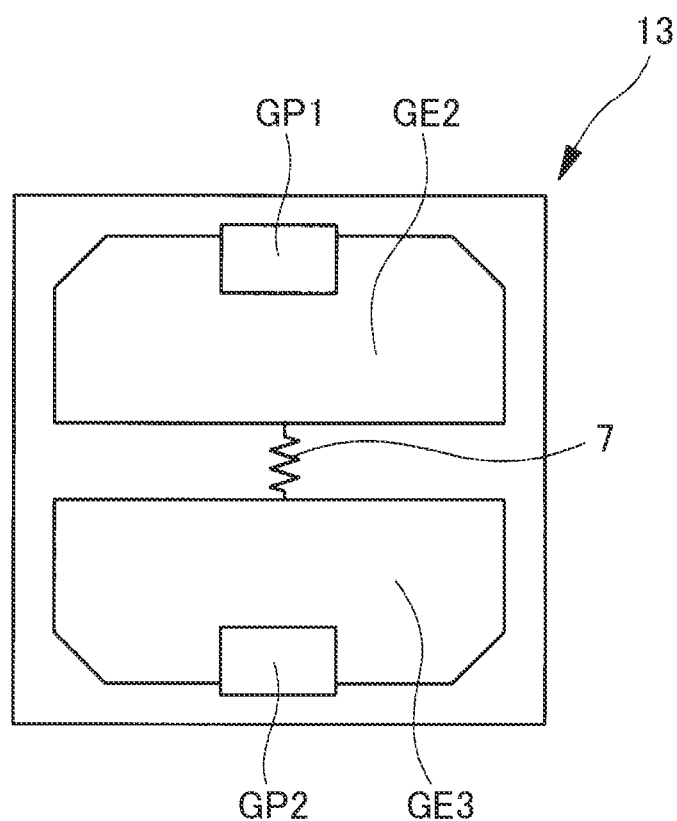
FIG. 8 is a typical circuit diagram of a semiconductor device showing a fifth modification of the first embodiment of the present invention.

As shown in FIG. 8, when gate electrodes GE2 and GE3 connected to gate pads GP1 and GP2 respectively are separated from each other, the gate electrodes GE2 and GE3 may be connected to each other through a resistor 7. FIG. 8 is a typical circuit diagram showing a semiconductor device being a fifth modification of the present embodiment. The resistor 7 provided in a semiconductor chip 13 is, for example, a polysilicon film or the like integrated with the gate electrodes GE2 and GE3 and has a width thinner than that of each of the gate electrodes GE2 and GE3.

Thus, even when the divided gate electrodes GE2 and GE3 are connected by the high resistor, it does not affect the voltages and waveforms or the like of the gate pads GP1 and GP2, and the equal potential can be applied to all gate electrodes GE2 and GE3 in a steady state, so that a stable operation can be performed.

Sixth Modification

Figure 9:
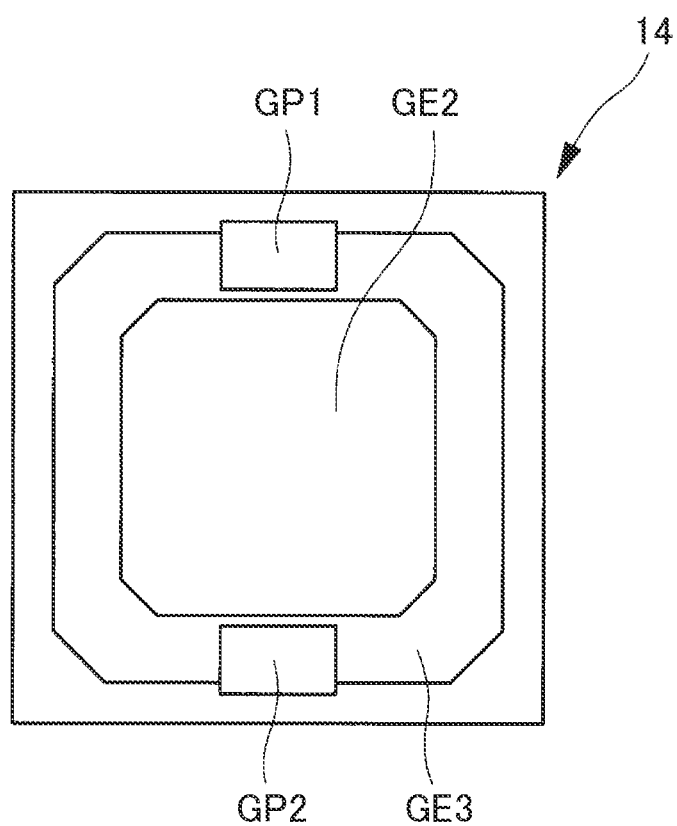
FIG. 9 is a typical circuit diagram of a semiconductor device showing a sixth modification of the first embodiment of the present invention.

As shown in FIG. 9, when gate electrodes GE2 and GE3 respectively connected to gate pads GP1 and GP2 are separated from each other, the gate electrode GE2 is disposed in the center of a semiconductor chip 14, and the ring-shaped gate electrode GE3 may be formed to surround the outer periphery of the gate electrode GE2. FIG. 9 is a typical circuit diagram showing a semiconductor device being a sixth modification of the present embodiment. Incidentally, the gate pad GP1 and the gate electrode GE2 are separated from each other here, but wirings (not shown) connecting them to each other are provided within the semiconductor chip 14.

In a vertical power MOSFET, a so-called termination part at the outer periphery of the semiconductor chip 14 is easy to cause deterioration or the like because of becoming an electric field condition different from that in the central part of the semiconductor chip 14. Therefore, it is possible to perform an effective chip operation by comparing the outer peripheral part of the semiconductor chip 14 with its central part.

Seventh Modification

Figure 10:
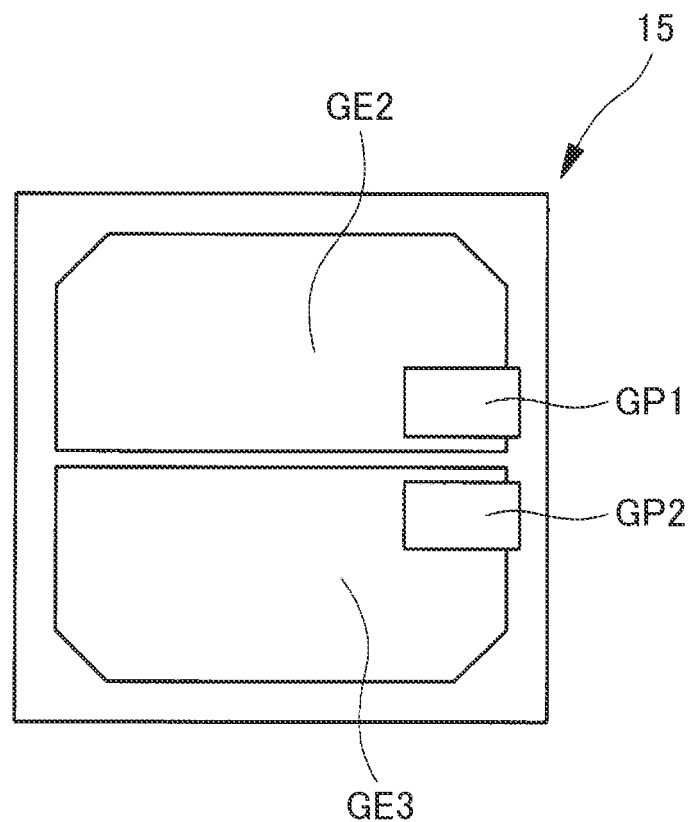
FIG. 10 is a typical circuit diagram of a semiconductor device showing a seventh modification of the first embodiment of the present invention.

As shown in FIG. 10, when gate electrodes GE2 and GE3 respectively connected to gate pads GP1 and GP2 are separated from each other, the gate pads GP1 and GP2 may be disposed to be adjacent to each other at positions close to each other. FIG. 10 is a typical circuit diagram showing a semiconductor device being a seventh modification of the present embodiment.

That is, when the gate electrodes GE2 and GE3 are arranged in the direction along one side of a rectangular semiconductor chip 15, the gate pads GP1 and GP2 are disposed in the vicinity of the one side of the semiconductor chip 15. Consequently, the distances for routing of a wiring from a gate driver to the gate pad GP1 and a wiring from the gate driver to the gate pad GP2 can be aligned, so that effective differential characteristics can be obtained.

That is, when a plurality of semiconductor chips 15 are disposed side by side within a module, wirings supplying power to gate electrodes GE2 and GE3 of each semiconductor chip 15 are disposed along one predetermined side of the semiconductor chip 15. Therefore, it is effective to dispose the gate pads GP1 and GP2 close to one side of the semiconductor chip 15 as in the present modification from the point of view of aligning the lengths of bonding wires connecting the wirings and the gate pads GP1 and GP2.

Second Embodiment

Figure 11:
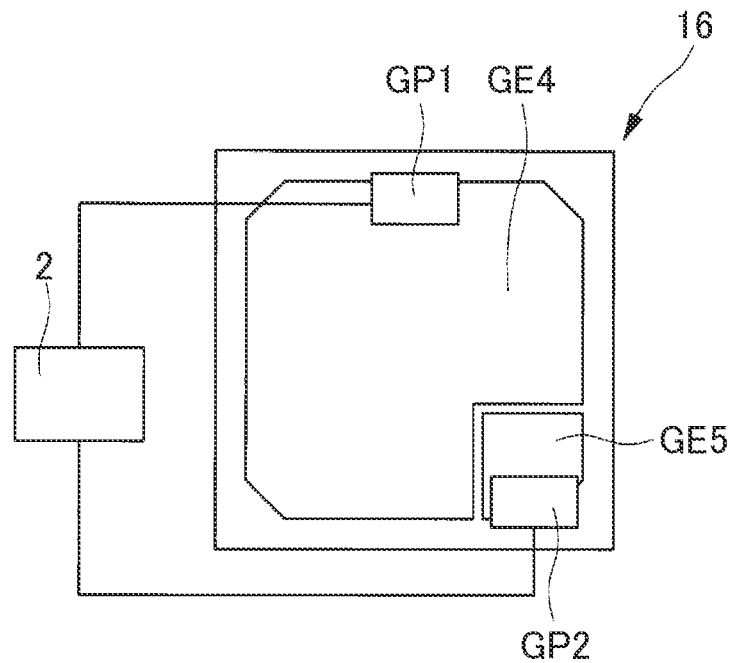
FIG. 11 is a typical circuit diagram of a semiconductor device showing a second embodiment of the present invention.
Figure 12:
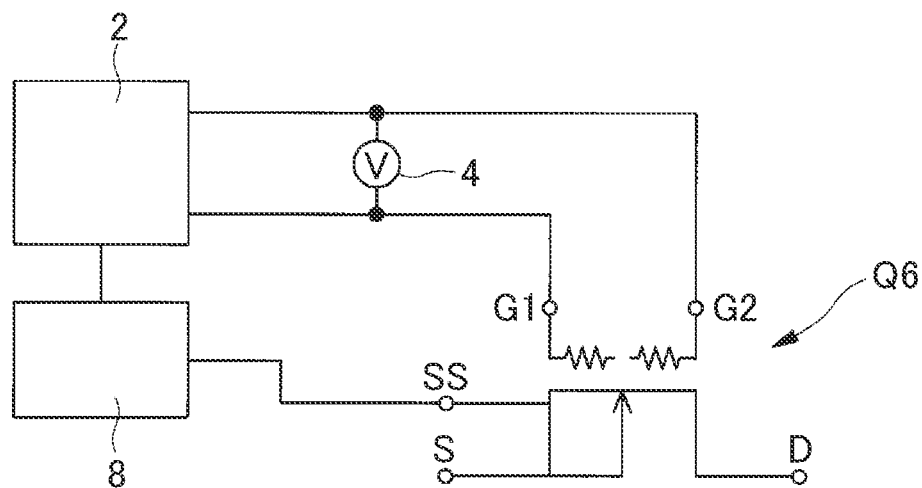
FIG. 12 is a circuit diagram of the semiconductor device showing the second embodiment of the present invention.
Figure 13:
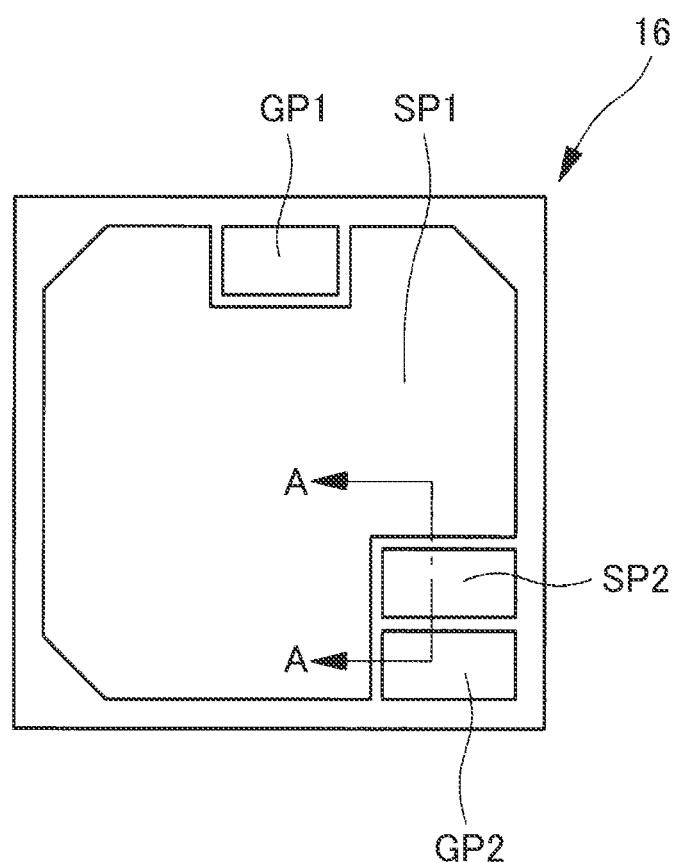
FIG. 13 is a plan view of the semiconductor device showing the second embodiment of the present invention.
Figure 14:
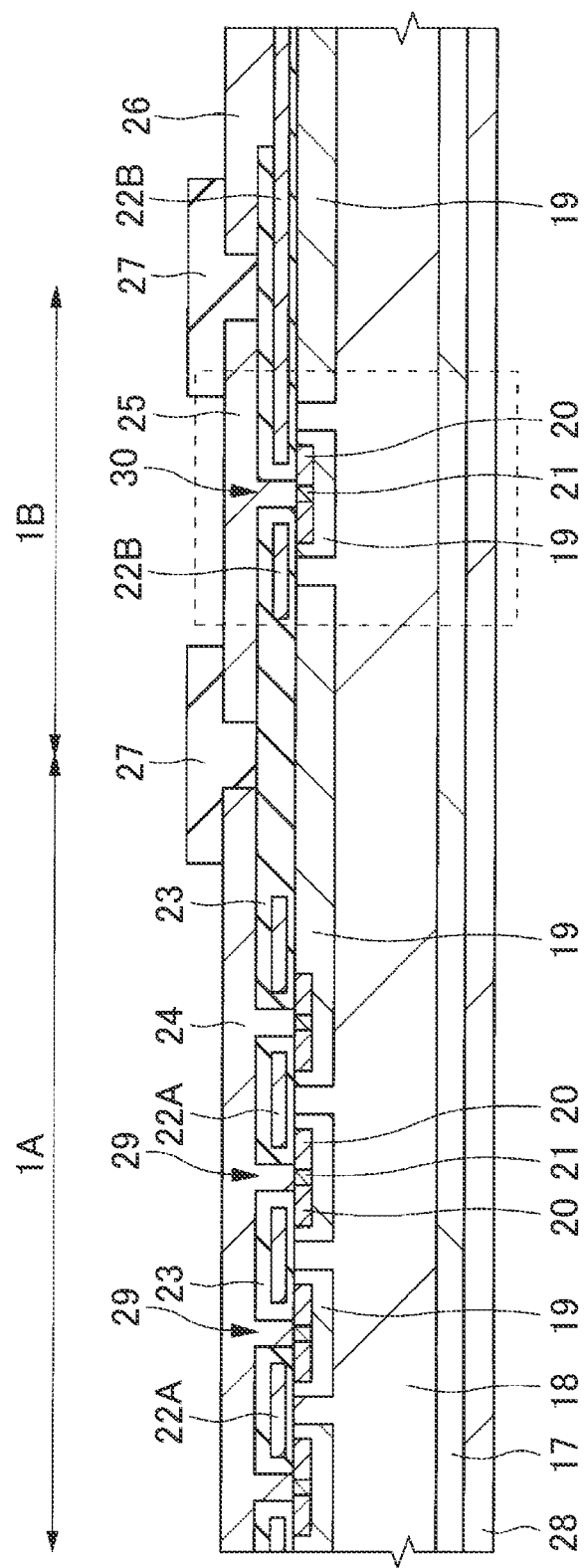
FIG. 14 is a cross-sectional view taken along line A-A of FIG. 13.

In the present second embodiment, description will be made using FIGS. 11 to 14 about a case where in a semiconductor chip in which a power MOSFET and a source sense element are mixedly mounted, a gate pad connected to a gate electrode of the power MOSFET and a gate pad connected to a gate electrode of a source sense element are formed. FIG. 11 is a typical circuit diagram of a semiconductor device of the present embodiment. FIG. 12 is a circuit diagram of the semiconductor device of the present embodiment. FIG. 13 is a plan view of the semiconductor device of the present embodiment. FIG. 14 is a cross-sectional view of the semiconductor device of the present embodiment. FIG. 14 is a cross-sectional view taken along line A-A of FIG. 13.

As shown in FIG. 11, a semiconductor chip 16 which constitutes the semiconductor device of the present embodiment is formed with a source sense element. That is, the semiconductor chip 16 has an element of a main body part operated as a power MOSFET having a gate electrode GE4, and a source sense element having a gate electrode GE5 and used for detection of an overcurrent. The gate electrode GE4 covers the majority of the main surface of the semiconductor chip 16, and the gate electrode GE5 covers a relatively small region at the corner of the main surface of the semiconductor chip 16. The source sense element is formed in a region where it overlaps with the gate electrode GE5 in plan view. Therefore, a current flowing through the source sense element comprised of a relatively small number of unit cells is smaller than a current flowing through the element of the main body part of the power MOSFET comprised of a large number of unit cells. Specifically, at the normal operation time, the magnitude of the current flowing through the source sense element is about $\frac{1}{1000}$ to $\frac{1}{10000}$ of the magnitude of the current flowing through the element of the main body part. That is, a drive current of the source sense element is smaller than that of the element of the main body part.

Gate pads GP1 and GP2 separated from each other are formed on the side of the main surface of the semiconductor chip 16. The gate pad GP1 is electrically connected to the gate electrode GE4, and the gate pad GP2 is electrically connected to the gate electrode GE5. Each of the gate pads GP1 and GP2 is connected to a gate driver 2. A circuit diagram of such a configuration is shown in FIG. 12.

As shown in FIG. 12, a transistor Q6 including the element of the main body part and the source sense element has a node S connected to its source and a node D connected to its drain. Further, the transistor Q6 has a node G1 connected to its gate (gate electrode GE4 shown in FIG. 11) and a node G2 connected to its gate (gate electrode GE5 shown in FIG. 11) constituting the source sense element.

One of two terminals of a voltmeter (potential measuring part) 4 for measuring the potential of the node G1 (gate pad GP1) is connected to a connecting path between the gate driver 2 and the node G1. Likewise, the other of the two terminals of the voltmeter (potential measuring part) 4 for measuring the potential of the node G2 (gate pad GP2) is connected to a connecting path between the gate driver 2 and the node G2.

Thus, the point of forming the two gate pads on the main surface side of the semiconductor chip, and the point of providing the measuring part for measuring the potentials or waveforms of those gate pads are similar to the first embodiment.

The source of the transistor Q6 is connected to a sense current measuring unit (sense current monitor) 8 through a node SS in addition to a supplying part (node S) of a source potential. That is, the current measuring unit 8 is connected in series with the source of the transistor Q6. Specifically, the current measuring unit 8 is connected in series with a source region constituting a MOSFET being a source sense element via a source pad SP2 (refer to FIG. 13). The sense current measuring unit 8 is connected to the gate driver 2. The sense current measuring part 8 is a device which measures a current value flowing between the source and drain of the source sense element and is a device outside the semiconductor chip 16 (refer to FIG. 11).

As shown in FIG. 13, the source pads SP1 and SP2 and the gate pads GP1 and GP2 respectively separated from each other in plan view are formed on the main surface of the semiconductor chip 16. The source pad SP1 is electrically connected to the source constituting the element of the main body part of the power MOSFET, and the source pad SP2 is electrically connected to the source constituting the source sense element. The node S shown in FIG. 12 corresponds to the source pad SP1, and the node SS shown in FIG. 12 corresponds to the source pad SP2. Since the current flowing through the source sense element is smaller than that flowing through the element of the main body part, the diameter of a bonding wire connected to the source pad SP2 is smaller than that of a bonding wire connected to the source pad SP1. Therefore, the area of the source pad SP1 is smaller than that of the source pad SP1.

As shown in FIG. 14, the element of the main body part of the power MOSFET and the source sense element share a drain region and a drain electrode. In FIG. 14, the source sense element is shown enclosed in a broken line. That is, the semiconductor chip 16 (refer to FIG. 11) of the present embodiment has a SiC substrate 17 being an n$^+$-type semiconductor substrate. An epitaxial layer (semiconductor layer) 18 including an n$^-$-type drift layer composed of SiC low in impurity concentration than the SiC substrate 17 is formed on the SiC substrate 17. The epitaxial layer 18 is formed in contact with the upper surface (main surface) of the SiC substrate 17. A laminated semiconductor substrate comprised of the substrate 17 and the epitaxial layer 18 has a cell area 1A in which the element of the main body part of the power MOSFET is formed, and a source sense area 1B formed with the source sense element. In the cell area 1A and the source sense area 1B, a cell structure of a plurality of n channel type MOSFETs is formed in the upper surface of the epitaxial layer 18. The laminated semiconductor substrate contains an n-type impurity (e.g., nitrogen (N) or phosphorus (P)).

A drain electrode 28 is formed on the side of the back surface on the side opposite to the main surface of the semiconductor chip 16 (refer to FIG. 11). Specifically, a drain region being an n$^+$-type semiconductor region is formed in the back surface (lower surface) of the SiC substrate 17. The drain electrode 28 is formed in contact with the bottom surface of the drain region.

In the cell area 1A and the source sense area 1B, a p-type semiconductor region (p well region, p-type body region) 19 is formed in plural numbers at a predetermined depth from the upper surface of the epitaxial layer 18. That is, a plurality of p-type semiconductor regions 19 are formed side by side at predetermined intervals within the epitaxial layer 18 including the upper surface of the epitaxial layer 18. The p-type semiconductor region 19 is a region into which a p-type impurity (e.g., aluminum (Al) or boron (B)) has been introduced. A source region 20 being an n$^+$-type semiconductor region is formed at a predetermined depth from the upper surface of the epitaxial layer 18 within each p-type semiconductor region 19. The source region 20 is a semiconductor region into which an n-type impurity (e.g., nitrogen (N) or phosphorus (P)) has been introduced.

Further, a potential fixing layer 21 being a p$^+$-type semiconductor region is formed at a predetermined depth from the upper surface of the epitaxial layer 18 within each p-type semiconductor region 19. The potential fixing layer 21 is a region provided to fix the potential of the p-type semiconductor region 19 and has a depth substantially similar to the source region 20. Each potential fixing layer 21 is in contact with the p-type semiconductor region 19 formed around the potential fixing layer 21. The potential fixing layer 21 is a semiconductor region in which a p-type impurity (e.g., aluminum (Al) or boron (B)) has been introduced. The impurity concentration of the potential fixing layer 21 is higher than that of the p-type semiconductor region 19. The potential fixing layer 21 and the source region 20 are formed shallower than the p-type semiconductor region 19.

A plurality of unit cells 29 each comprised of the p-type semiconductor region 19, the source region 20, and the potential fixing layer 21 are formed in the upper surface of the epitaxial layer 18 of the cell area 1A. A plurality of unit cell 30 each comprised of the p-type semiconductor region 19, the source region 20, and the potential fixing layer 21 are formed in the upper surface of the epitaxial layer 18 of the source sense area 1B. The plural unit cells 29 and 30 are respectively separated from each other. A gate electrode 22A is formed on the epitaxial layer 18 between the adjacent unit cells 29 through a gate insulating film. A gate electrode 22B is formed on the epitaxial layer 18 between the adjacent unit cells 30 through the gate insulating film. The upper surface of the p-type semiconductor region 19 being a region in which a channel is formed is covered with the gate electrode 22A or 22B.

The upper surface of the end of the gate insulating film, and the side and upper surfaces of each of the gate electrodes 22A and 22B are covered with an interlayer insulating film 23. In FIG. 14, the gate insulating film and the interlayer insulating film 23 are shown as an integrated insulating film. The gate electrode 22A corresponds to the gate electrode GE4 shown in FIG. 11, and the gate electrode 22B corresponds to the gate electrode GE5 shown in FIG. 11.

A laminated film comprised of the gate insulating film, the gate electrodes 22A and 22B, and the interlayer insulating film 23 has openings (through holes) each of which reaches the upper surface of each of the unit cells 29 and 30. The potential fixing layer 21 and the source region 20 are exposed from the laminated layer at the bottoms of the openings.

A contact plug (conductive connecting part) which buries the inside of the opening is electrically connected via a silicide layer (not shown) to each of the part of the source region 20 and the potential fixing layer 21 exposed from the laminated layer at the bottom in each opening of the interlayer insulating film 23 of the cell area 1A, i.e., its contact hole. Likewise, a contact plug (conductive connecting part) which buries the inside of the opening is electrically connected via a silicide layer (not shown) to each of the part of the source region 20 and the potential fixing layer 21 exposed from the laminated film at the bottom in the opening of the interlayer insulating film 23 of the source sense area 1B, i.e., its contact hole.

Each of the plural contact plugs embedded in the plural openings in the cell area 1A is integrated with a source electrode (metal electrode) 24 formed on the interlayer insulating film 23. Each of the plural contact plugs embedded in the plural openings in the source sense area 1B is integrated with a source electrode (metal electrode) 25 formed on the interlayer insulating film 23. An upper surface of the source electrode 24 constitutes, for example, the source pad SP1 (refer to FIG. 13), and an upper surface of the source electrode 25 constitutes, for example, the source pad SP2 (refer to FIG. 13).

An opening is formed in the interlayer insulating film 23 on the gate electrode 22B. A contact plug integrated with a gate metal electrode 26 formed on the interlayer insulating film 23 in the source sense area 1B is embedded in the opening. The gate electrode 22B and the gate metal electrode 26 are electrically connected through the contact plug. An upper surface of the gate metal electrode 26 constitutes, for example, the gate pad GP2 shown in FIG. 13. Likewise, in an unillustrated area of the cell area 1A, a gate metal electrode electrically connected to the gate electrode 22A is formed on the interlayer insulating film 23. An upper surface of the gate metal electrode constitutes, for example, the gate pad GP1 shown in FIG. 13. Each of the source electrodes 24 and 25 and the gate metal electrode 26 is insulated by a passivation film 27 formed on the interlayer insulating film 23.

The MOSFET (MOS type field effect transistor) formed in the cell area 1A of the semiconductor chip of the present embodiment has at least the gate electrode 22A, source region 20, and drain region in the SiC substrate 17. Further, the MOSFET being the source sense element formed in the source sense area 1B of the semiconductor chip of the present embodiment has at least the gate electrode 22B, source region 20, and drain region in the SiC substrate 17. That is, a plurality of unit cells of MOSFETs each having the same structure are formed in each of the cell area 1A and the source sense area 1B. However, the number of the unit cells of MOSFETs connected in parallel in the cell area 1A is larger than the number of the unit cells of MOSFETs connected in parallel in the source sense area 1B.

Upon operating the MOSFET, a predetermined voltage is applied to the gate electrodes 22A and 22B to turn on the MOSFET, thereby making a current flow from the drain high in potential to the source low in potential. A channel region of the MOSFET is formed above in the p-type semiconductor region 19. That is, the current at the time of driving the MOSFET flows from the drain electrode 28, passes through the inside of the epitaxial layer 18, passes through the region being in the p-type semiconductor region 19 and being directly below each of the gate electrodes 22A and 22B, and flows into each source region 20. In a normal state, a current of about 50 A flows through the MOSFET in the cell area 1A, and a current of about 1 μA or 1 mA flows through the MOSFET being the source sense element.

The source sense element is an element for detecting the occurrence of an overcurrent in the transistor Q6 shown in FIG. 12. That is, when, for example, a voltage corresponding to a high voltage (e.g., 400V) is applied to the drain of the transistor Q6 due to a short circuit or the like so that an overcurrent (e.g., 2000 A) flows between the source and drain of the power MOSFET, a small current flowing through the source sense element also increases. At this time, when an attempt is made to detect an overcurrent of about 2000 A directly, a device for the detection is broken down by the overcurrent. Therefore, the increase in the small current of the source sense element is detected by the sense current measuring unit 8, so that the occurrence of the overcurrent in the element of the main body part of the transistor Q6 can be detected (anticipated), and measures such as cutting off of the transistor Q6 form the circuit can be taken. With this, it is possible to protect a semiconductor chip, a module having the semiconductor chip, and a vehicle using the module, etc. from destruction, ignition, etc.

However, when the overcurrent flows through the semiconductor chip where the semiconductor chip is abnormally generating heat, the current becomes easy to flow through the element of the main body part of the power MOSFET as compared with the case where the heat generation of the semiconductor chip is small. At this time, since the source sense element is separated from the element of the main body part, the temperature rise due to its self-heating is small as compared with the element of the main body part large in the temperature rise due to its self-heating. As a result, a problem arises in that even if the overcurrent flows through the semiconductor chip generating heat, the amount of the increase in the small current in the source sense element is small so that the occurrence of the overcurrent cannot be detected accurately. Such a problem occurs, for example, in the case where only one gate pad is formed in the semiconductor chip, and the voltage is supplied from the gate pad to the gate electrode of each of the element of the main body part and the source sense element.

Thus, in the present embodiment, the gate pad GP1 connected to the gate electrode of the element of the main body part, the gate pad GP2 connected to the gate electrode of the source sense element, and the voltmeter 4 shown in FIG. 12 are provided as shown in FIG. 11. Consequently, it is possible to monitor the temperature of the element of the main body part and the temperature of the source sense element by the voltage or waveform obtained by the voltmeter 4.

The relationship between the amounts of changes in the currents of the element of the main body part and the source sense element with respect to the relationship between the temperatures of the element of the main body part and the source sense element can be judged from a plurality of data (lookup table) obtained by experiments or the like. Accordingly, when it is detected that the temperature of the element of the main body part or the temperature of the source sense element is abnormally high, their temperatures can be applied to the look-up table to judge the presence or absence of occurrence of the overcurrent in the element of the main body part from the amount of an increase in the current of the source sense element. Thus, the temperature of the semiconductor chip is predicted by the voltage or waveform obtained by the voltmeter 4, and further temperature compensation feedback is performed on the source sense element, whereby the overcurrent in the semiconductor chip can be detected accurately. That is, the accuracy of detection of the overcurrent by the source sense element is improved. It is thus possible to improve the reliability of the semiconductor device.

Further, the semiconductor chip of the present embodiment is used for a three-layer inverter which constitutes a three-layer motor, for example. In this case, a PWM (Pulse Width Modulation) control unit is connected to the three-layer inverter. The PWM control unit is a device which transmits a gate signal (pulse signal) to the gate of each of, for example, six power MOSFETs (semiconductor chips) constituting the three-layer inverter to control the operation of the three-layer inverter. Further, it is considered that the three-layer inverter is connected to a motor (load), and a Hall element for current detection is provided in the middle of a path to feed a current from each semiconductor chip to the motor. The Hall element is a highly accurate current detecting element for preventing an overcurrent from flowing through the motor and causing the motor to operate abnormally. When the Hall element detects an abnormal current, feed back to the PWM control unit is performed to control the rotation of the motor.

In this case, the overcurrent is doubly detected by using the source sense element and the Hall element. However, the Hall element is a relatively expensive element. Thus, by omitting it, it is also possible to significantly lower the cost of the three-layer motor and reduce the size of the three-layer motor.

In the present embodiment, since the current detection accuracy of the source sense element can be improved, it is possible to prevent the abnormal operation of the three-layer motor due to the overcurrent by using the source sense element. Accordingly, it is possible to omit the Hall element and realize the lowering of cost in the three-layer motor and the reduction in the three-layer motor.

Although the invention made by the present inventors has been specifically described above based on the embodiments, the present invention is not limited to the embodiments, and can be modified in various ways within the scope not departing from the gist thereof.

For example, although description has been made about the formation of the two gate pads on the main surface side of each semiconductor chip in the first and second embodiments, the number of gate pads may be three or more. For example, in the case of the second embodiment, the gate pad connected to the source sense element and the two gate pads connected to the element of the main body part may be formed.

INDUSTRIAL APPLICABILITY

The present invention can be widely used in semiconductor devices each having MOSFETs.

LIST OF REFERENCE SIGNS

2 . . . gate driver,
4 . . . voltmeter,
D, G1, G2, S . . . node
GE1 to GE5 . . . gate electrode
GP1, GP2 . . . gate pad,
Q1 to Q6 . . . transistor,
SP1, SP2 . . . source pad.

The invention claimed is:
1. A semiconductor device comprising:
a semiconductor chip having a first gate pad and a second gate pad in a main surface;
a first wiring provided outside the semiconductor chip and electrically connected to the first gate pad;
a second wiring provided outside the semiconductor chip and electrically connected to the second gate pad; and
a first voltmeter connected between the first wiring and the second wiring, wherein the semiconductor chip includes:
a substrate of a first conductivity type;
a source region of a second conductivity type different from the first conductivity type, which is formed in an upper surface of the substrate;
a drain region of the second conductivity type formed in a lower surface of the substrate;
a first gate electrode formed on the substrate and electrically connected to the first gate pad; and
a second gate electrode formed on the substrate and electrically connected to the second gate pad,
wherein the first gate electrode, the source region, and the drain region constitute a first field effect transistor,
wherein the second gate electrode, the source region, and the drain region constitute a second field effect transistor, wherein a current measuring unit is connected in series with the source region which constitutes the second field effect transistor, wherein the first gate pad, the second gate pad, a first source pad, and a second source pad are formed in the main surface of the semiconductor chip, wherein the first source pad is electrically connected to the source region of the first field effect transistor, wherein the second source pad is electrically connected to the source region of the second field effect transistor, and wherein the area of the first source pad is larger than that of the second source pad.

2. The semiconductor device according to claim 1, further including a gate drive unit, wherein the gate drive unit is electrically connected to the first gate pad through the first wiring, and wherein the gate drive unit is electrically connected to the second gate pad through the second wiring.

3. The semiconductor device according to claim 2, further including a command control unit which controls the gate drive unit, wherein a plurality of the semiconductor chips are electrically connected to the command control unit through the gate drive unit.

4. The semiconductor device according to claim 2, wherein a second voltmeter is connected in parallel with a wiring electrically connecting the gate drive unit and the source region.

5. The semiconductor device according to claim 1, wherein the substrate contains silicon carbide.

6. A semiconductor device comprising:

a semiconductor chip having a first gate pad and a second gate pad in a main surface;

a first wiring provided outside the semiconductor chip and electrically connected to the first gate pad;

a second wiring provided outside the semiconductor chip and electrically connected to the second gate pad; and a first voltmeter connected between the first wiring and the second wiring, wherein the semiconductor chip includes:

a substrate of a first conductivity type;

a source region of a second conductivity type different from the first conductivity type, which is formed in an upper surface of the substrate;

a drain region of the second conductivity type formed in a lower surface of the substrate;

a first gate electrode formed on the substrate and electrically connected to the first gate pad; and a second gate electrode formed on the substrate and electrically connected to the second gate pad, wherein the first gate electrode, the source region, and the drain region constitute a first field effect transistor, wherein the second gate electrode, the source region, and the drain region constitute a second field effect transistor, wherein a current measuring unit is connected in series with the source region which constitutes the second field effect transistor, wherein a drive current of the second field effect transistor is smaller than that of the first field effect transistor, and wherein the second field effect transistor constitutes a source sense element.

7. The semiconductor device according to claim 6, further including a gate drive unit, wherein the gate drive unit is electrically connected to the first gate pad through the first wiring, and wherein the gate drive unit is electrically connected to the second gate pad through the second wiring.

8. The semiconductor device according to claim 7, further including a command control unit which controls the gate drive unit, wherein a plurality of the semiconductor chips are electrically connected to the command control unit through the gate drive unit.

9. The semiconductor device according to claim 7, wherein a second voltmeter is connected in parallel with a wiring electrically connecting the gate drive unit and the source region.

10. The semiconductor device according to claim 6, wherein the substrate contains silicon carbide.

11. A semiconductor device comprising:

a semiconductor chip having a first gate pad and a second gate pad in a main surface;

a first wiring provided outside the semiconductor chip and electrically connected to the first gate pad;

a second wiring provided outside the semiconductor chip and electrically connected to the second gate pad; and a first voltmeter connected between the first wiring and the second wiring, wherein the semiconductor chip includes:

a substrate of a first conductivity type;

a source region of a second conductivity type different from the first conductivity type, which is formed in an upper surface of the substrate;

a drain region of the second conductivity type formed in a lower surface of the substrate;

a first gate electrode formed on the substrate and electrically connected to the first gate pad; and a second gate electrode formed on the substrate and electrically connected to the second gate pad, wherein the first gate electrode, the source region, and the drain region constitute a first field effect transistor, wherein the second gate electrode, the source region, and the drain region constitute a second field effect transistor, wherein a planar shape of each of the first gate electrode and the second gate electrode is comb-shaped, and wherein the first gate electrode and the second gate electrode are disposed such that mutual comb-teeth parts mesh with each other.

12. The semiconductor device according to claim 11, wherein the substrate contains silicon carbide.

13. A semiconductor device comprising:

a semiconductor chip having a first gate pad and a second gate pad in a main surface;

a first wiring provided outside the semiconductor chip and electrically connected to the first gate pad;

a second wiring provided outside the semiconductor chip and electrically connected to the second gate pad; and a first voltmeter connected between the first wiring and the second wiring, wherein the semiconductor chip includes:

a substrate of a first conductivity type;

a source region of a second conductivity type different from the first conductivity type, which is formed in an upper surface of the substrate;

a drain region of the second conductivity type formed in a lower surface of the substrate;

a first gate electrode formed on the substrate and electrically connected to the first gate pad; and a second gate electrode formed on the substrate and electrically connected to the second gate pad, wherein the first gate electrode, the source region, and the drain region constitute a first field effect transistor,
wherein the second gate electrode, the source region, and the drain region constitute a second field effect transistor, and
wherein the second gate electrode is formed in a ring shape so as to surround an outer periphery of the first gate electrode.

14. The semiconductor device according to claim 13, wherein the substrate contains silicon carbide.

* * * * *